United States Patent
Lauffenburger et al.

(10) Patent No.: US 6,472,942 B1
(45) Date of Patent: Oct. 29, 2002

(54) PARASITICALLY COMPENSATED RESISTOR FOR INTEGRATED CIRCUITS

(75) Inventors: James Harold Lauffenburger, Colorado Springs, CO (US); John William Arachtingi, Colorado Springs, CO (US); Kevin Scott Buescher, Colorado Springs, CO (US); Gil Afriat, Colorado Springs, CO (US)

(73) Assignee: EM (US) Design, Inc., Colorado Springs, CO (US)

( * ) Notice: Subject to any disclaimer, the term of this patent is extended or adjusted under 35 U.S.C. 154(b) by 0 days.

(21) Appl. No.: 09/642,429

(22) Filed: Aug. 21, 2000

(51) Int. Cl.[7] .............................. H03F 1/14; H01L 29/00
(52) U.S. Cl. .................... 330/292; 330/307; 257/528
(58) Field of Search .................................. 330/292, 307, 330/308; 250/214 A, 214 AG

(56) References Cited

U.S. PATENT DOCUMENTS

| | | | | |
|---|---|---|---|---|
| 5,111,156 A | * | 5/1992 | Hachiuma | 330/308 |
| 5,780,333 A | * | 7/1998 | Kim | 438/238 |
| 6,005,280 A | * | 12/1999 | Dierschke et al. | 257/528 |
| 6,137,101 A | * | 10/2000 | Yokogawa et al. | 250/214 A |
| 6,211,769 B1 | * | 4/2001 | Baldwin et al. | 338/7 |

* cited by examiner

Primary Examiner—Robert Pascal
Assistant Examiner—Khanh Van Nguyen
(74) Attorney, Agent, or Firm—Dale B. Halling

(57) ABSTRACT

A parasitically compensated resistor (50) for integrated circuits includes a substrate (52). A polysilicon resistor (54) is formed in the substrate (52). The polysilicon resistor (54) has a first end connected to a first lead (56) and a second end connected to a second lead (58). A conductive layer (62) is capacitively connected to the polysilicon resistor (54).

13 Claims, 3 Drawing Sheets

PARASITICALLY COMPENSATED RESISTOR FOR INTEGRATED CIRCUITS

FIELD OF THE INVENTION

The present invention relates generally to the field of integrated circuits and more particularly to a parasitically compensated resistor for integrated circuits.

BACKGROUND OF THE INVENTION

The gain of a transimpedance amplifier is related to the resistance of a feedback resistor. As a result, to obtain large gains it is necessary to have a large feedback resistor. In an integrated circuit, a large resistor has a large parasitic capacitance that significantly reduces the bandwidth of the amplifier circuit. One solution has been to use a transistor as the feedback resistor. This reduces the parasitic capacitance and large effective resistance values can be obtained. Unfortunately, transistors do not produce a constant resistance value for various currents. This results in an amplifier circuit that does not have a constant gain.

Thus there exists a need for a feedback resistor circuit that does not degrade the bandwidth of the amplifier circuit and provides a constant gain.

DETAILED DESCRIPTION OF THE DRAWINGS

A parasitically compensated resistor for integrated circuits includes a substrate. A polysilicon resistor is formed on the substrate. The polysilicon resistor has a first end connected to a first lead and a second end connected to a second lead. A conductive layer is capacitively connected to the polysilicon resistor. The conductive layer forms a series capacitor that is designed to produce a zero at the same frequency that the parasitic capacitance and polysilicon resistor form a pole. As a result the pole is cancelled.

Figure 1:
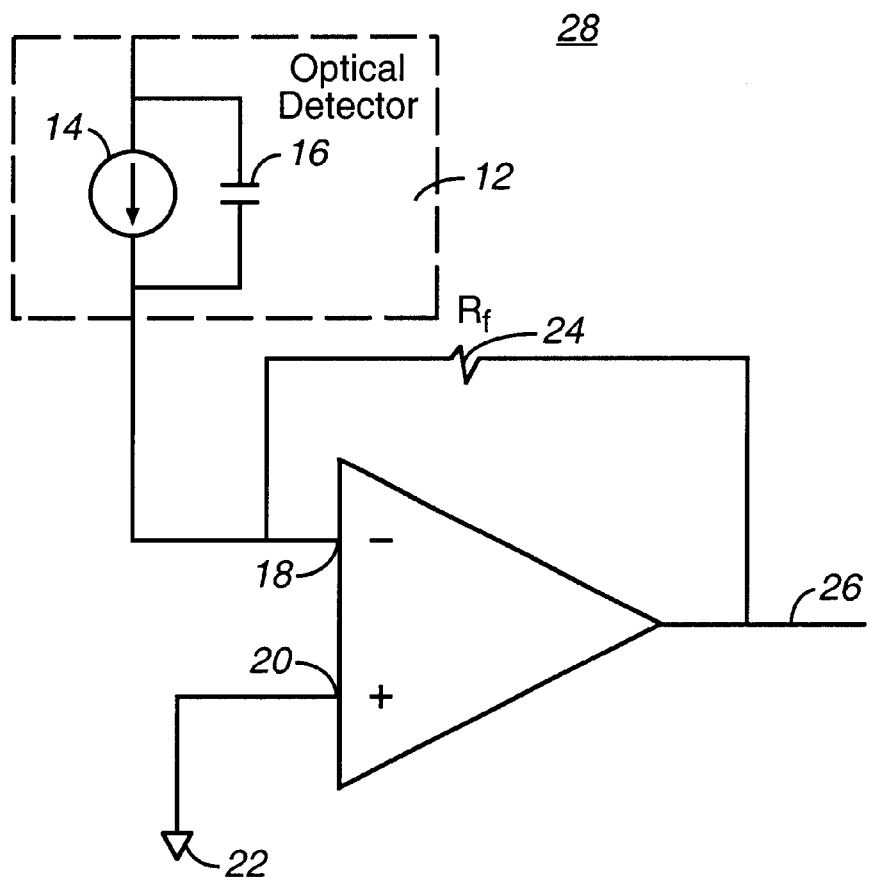
FIG. 1 is a circuit diagram of a transimpedance amplifier connected to an optical detector in accordance with one embodiment of the invention.

FIG. 1 is a circuit diagram of a transimpedance amplifier 10 connected to an optical detector 12 in accordance with one embodiment of the invention. The optical detector 12 is represented as a current source 14 with a parallel capacitance 16. The current source 14 has an output current that is proportional to an input light. The output of the current source 14 is connected to an inverting input 18 of the transimpedance amplifier (operational amplifier) 10. A non-inverting input 20 of the operational amplifier 10 is connected to a ground 22. A feedback resistor (semiconductor resistor) 24 is connected between an output 26 of the operational amplifier 10 and the inverting input 18 of the operational amplifier 10.

Figure 2:
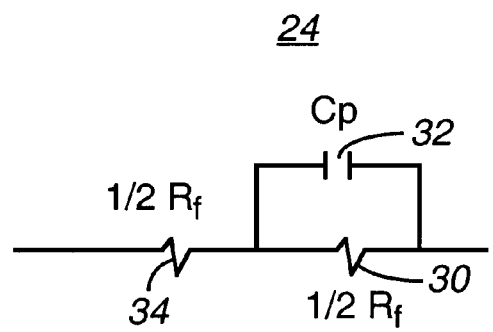
FIG. 2 is a model of the effective circuit created by a feedback resistor in accordance with one embodiment of the invention.

In one embodiment, the transimpedance amplifier circuit 28 is used for amplifying optical signals received from an optical storage medium. This application requires that the amplifier circuit 28 have a large bandwidth and high gain. In order to obtain high gain values, the feedback resistor 24 must be large as described above. This results in a parasitic capacitance that limits the bandwidth of the circuit 28. FIG. 2 is a model of the effective circuit created by a feedback resistor 24 in accordance with one embodiment of the invention. The effective circuit 24 has a first resistor 30 with half the total resistance. A parasitic capacitor 32 is in parallel with the first resistor 30. A second resistor 34 is in series with the first resistor 30.

Figure 3:
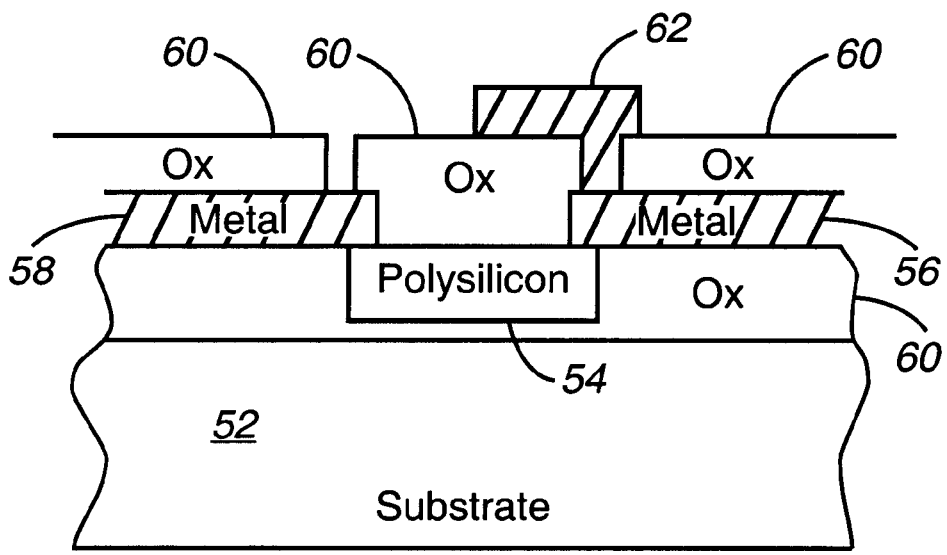
FIG. 3 is a cross section of a parasitically compensated resistor for an integrated circuit in accordance with one embodiment of the invention.

FIG. 3 is a cross section of a parasitically compensated resistor 50 for an integrated circuit in accordance with one embodiment of the invention. The parasitically compensated resistor 50 has a substrate 52. A polysilicon resistor 54 is formed on the substrate 52. A first lead 56 is connected to a first end of the polysilicon resistor 54. A second lead 58 is connected to a second end of the polysilicon resistor 54. An insulating layer ($O_x$) 60 is formed over a portion of the polysilicon 54 and leads 56, 58. A conductive layer 62 is electrically connected to the first lead 56 and capacitively connected to the polysilicon resistor 54.

The parasitic capacitance of the polysilicon resistor 54 creates a pole that limits the bandwidth of the amplifier circuit. The conductive layer 62 results in a capacitance that is connected to ground. This creates a zero in the circuit. By adjusting the capacitance of the conductive layer 62, the frequency of the pole and zero can be aligned. When this is accomplished the bandwidth of the amplifier circuit 28 is not limited by the feedback resistor 24. In one embodiment, the conductive layer is a metal. In another embodiment a first capacitance between the polysilicon layer and the conductive layer is approximately half of a second capacitance between the polysilicon layer and the substrate.

Figure 4:
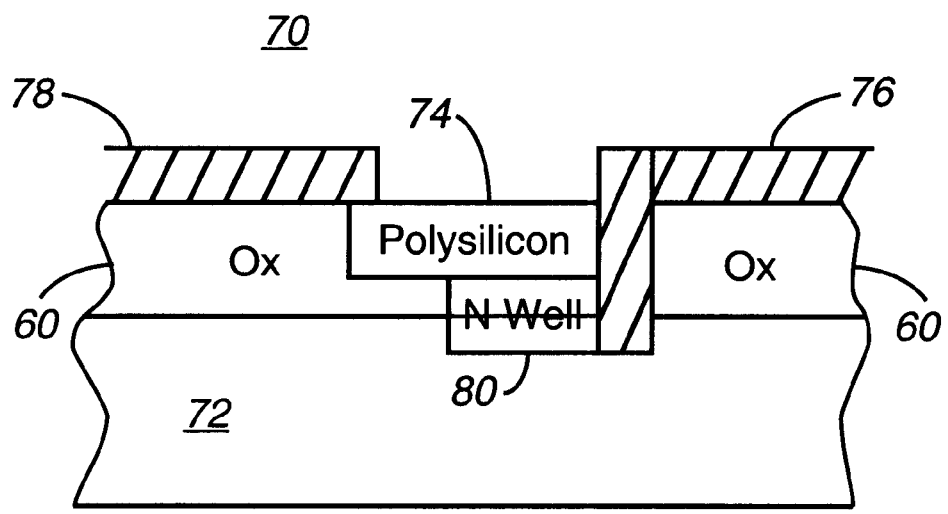
FIG. 4 is a cross section of a parasitically compensated resistor for an integrated circuit in accordance with one embodiment of the invention.

FIG. 4 is a cross section of a parasitically compensated resistor 70 for an integrated circuit in accordance with one embodiment of the invention. The parasitically compensated resistor 70 has a substrate 72. A polysilicon resistor 74 is formed on the substrate 72. A first lead 76 is connected to a first end of the polysilicon resistor 74. A second lead 78 is connected to a second end of the polysilicon resistor 74. An n-well 80 is formed adjacent to the polysilicon resistor 74. The n-well 80 is electrically connected to the first lead 76 but not electrically connected to the second lead 78. The n-well 80 is capacitively coupled to the polysilicon resistor 74.

Figure 5:
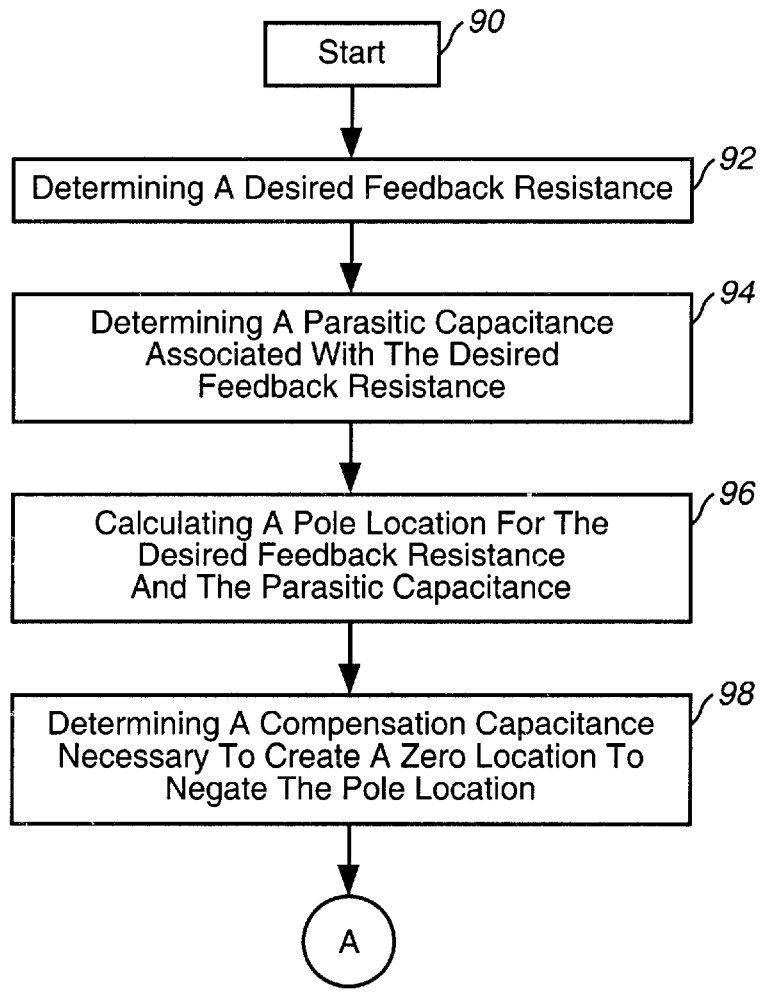
FIGS. 5 & 6 are a flow chart of the steps of creating a parasitically compensated resistor for an integrated circuit in accordance with one embodiment of the invention.
Figure 6:
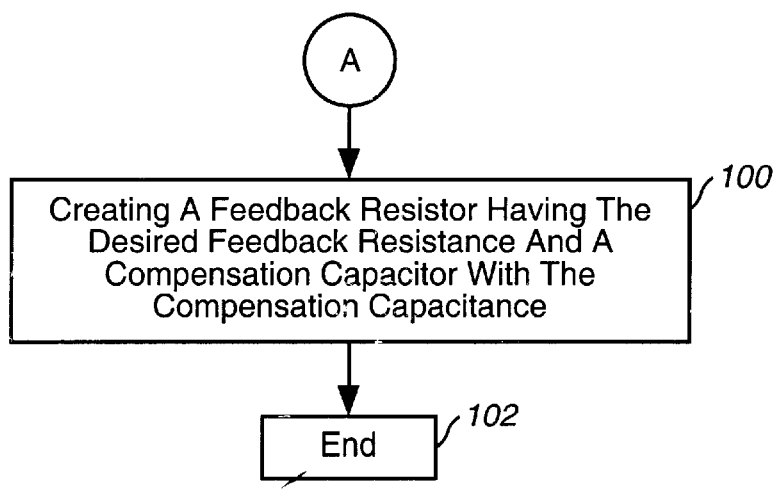

FIGS. 5 & 6 are a flow chart of the steps of creating a parasitically compensated resistor for an integrated circuit in accordance with one embodiment of the invention. The process starts, step 90, by determining a desired feedback resistance at step 92. A parasitic capacitance associated with the desired feedback resistance is determined at step 94. A pole location for the desired feedback resistance and the parasitic capacitance is calculated at step 96. A compensation capacitance necessary to create a zero location to negate the pole location is determined at step 98. At step 100, the feedback resistor having the desired feedback resistance and the compensation capacitor with the compensation capacitance is created which ends the process at step 102. In one embodiment a required gain for the transimpedance amplifier is determined. In another embodiment, an input current from a photodetector is determined.

In one embodiment, a polysilicon strip is formed on a substrate. A conductive layer that is capacitively coupled to the polysilicon strip is created. An insulating layer is formed over the polysilicon strip, before a metal strip is formed over the insulting layer. In another embodiment, an n-well is created adjacent to the polysilicon.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A transimpedance amplifier integrated circuit having a parasitically compensated resistor, comprising:
   a current source;
   an operational amplifier having an inverting input connected to the current source and an non-inverting input connected to a ground;
   a semiconductor resistor connected between an output of the operational amplifier and the inverting input; and
   a conductive layer capacitively coupled to the semiconductor resistor and electrically connected to the output of the operational amplifier but not electrically connected to the inverting input.

2. The circuit of claim 1, wherein the current source is an optical detector with an associated capacitance.

3. The circuit of claim 1, wherein the semiconductor resistor is a polysilicon strip.

4. The circuit of claim 1, wherein the conductive layer is a metal.

5. The circuit of claim 1, wherein a first capacitance between the conductive layer and the semiconductor resistor is approximately half a second capacitance between the semiconductor resistor and a substrate.

6. The circuit of claim 1, wherein a first capacitance between the conductive layer and the semiconductor resistor is selected to create a zero location to negate a pole location determined by a resistance of said semiconductor resistor and a second capacitance between the semiconductor resistor and a substrate.

7. The circuit of claim 1, wherein the conductive layer is an n-well formed in a substrate adjacent to the semiconductor resistor.

8. A method of forming a parasitically compensated resistor for a transimpedance amplifier integrated circuit, comprising:
   a) determining a desired feedback resistance;
   b) determining a parasitic capacitance associated with the desired feedback resistance;
   c) calculating a pole location for the desired feedback resistance and the parasitic capacitance;
   d) determining a compensation capacitance necessary to create a zero location to negate the pole location; and
   e) creating a feedback resistor having the desired feedback resistance and a compensation capacitor with the compensation capacitance.

9. The method of claim 8, wherein step (a) further includes the step of:
   a1) determining a required gain for the transimpedance amplifier.

10. The method of claim 9, wherein step (a1) further includes the step of:
    i) determining an input current from a photodetector.

11. The method of claim 8, wherein step (e) further includes the step of:
    e1) creating a polysilicon strip that is capacitively coupled to a substrate;
    e2) creating a conductive layer that is capacitively coupled to the polysilicon strip.

12. The method of claim 11, wherein step (e2) further includes the steps of:
    i) forming an insulating layer over the polysilicon strip;
    ii) forming a metal strip over the insulating layer.

13. The method of claim wherein step (e2) further includes the step of:
    i) creating an n-well in the substrate adjacent to the polysilicon layer.

* * * * *